United States Patent
Parikh et al.

(10) Patent No.: US 6,514,671 B1
(45) Date of Patent: Feb. 4, 2003

(54) INTERCONNECT LINE FORMED BY DUAL DAMASCENE USING DIELECTRIC LAYERS HAVING DISSIMILAR ETCHING CHARACTERISTICS

(75) Inventors: Suketu A. Parikh, Santa Clara, CA (US); Mehul B. Naik, San Jose, CA (US); Samuel Broydo, Los Altos Hills, CA (US); H. Peter W. Hey, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/675,989

(22) Filed: Sep. 29, 2000

Related U.S. Application Data

(62) Division of application No. 09/133,075, filed on Aug. 12, 1998.

(51) Int. Cl.[7] .................................................. G03C 5/00
(52) U.S. Cl. ........................ 430/313; 430/317; 438/629; 438/637; 438/638; 216/16
(58) Field of Search ................................ 430/313–317; 438/629–637, 638; 216/16

(56) References Cited

U.S. PATENT DOCUMENTS

| | | | |
|---|---|---|---|
| 5,354,711 A | 10/1994 | Heitzmann et al. | 437/182 |
| 5,439,780 A | 8/1995 | Joshi et al. | 430/296 |
| 5,592,024 A | 1/1997 | Aoyama et al. | 257/751 |
| 5,614,765 A | 3/1997 | Avanzino et al. | 257/774 |
| 5,635,423 A | 6/1997 | Huang et al. | 437/195 |
| 5,651,855 A | 7/1997 | Dennison et al. | 156/636.1 |
| 5,691,238 A | 11/1997 | Avanzino et al. | 437/195 |
| 5,705,430 A | 1/1998 | Avanzino et al. | 437/195 |
| 5,726,100 A | 3/1998 | Givens | 438/702 |
| 5,739,579 A | 4/1998 | Chiang et al. | 257/635 |
| 5,741,626 A | 4/1998 | Jain et al. | 430/314 |
| 5,759,911 A | 6/1998 | Cronin et al. | 438/622 |
| 5,897,369 A | 4/1999 | Jun | 438/629 |
| 6,017,817 A | 1/2000 | Chung et al. | 438/637 |
| 6,127,263 A | 10/2000 | Parikh | 438/637 |
| 6,133,144 A | 10/2000 | Tsai et al. | 438/634 |
| 6,143,646 A | 11/2000 | Wetzel | 438/637 |
| 6,204,168 B1 * | 3/2001 | Naik et al. | 438/638 |
| 6,391,771 B1 | 5/2002 | Naik et al. | 438/653 |

FOREIGN PATENT DOCUMENTS

| | | | |
|---|---|---|---|
| EP | 0680085 A | 11/1995 | ......... H01L/21/768 |
| EP | 0851483 | 7/1998 | ......... H01L/21/768 |
| EP | 0911697 A | 4/1999 | ............. G03F/1/00 |

OTHER PUBLICATIONS

Kaanta et al., "Dual Damascene: A ULSI Wiring Technology", VMIC Conference, IEEE, pp. 144–152, Jun. 11–12, 1991.

U.S. patent application Ser. No. 09/017,350, Naik, filed Feb. 2, 1998.

* cited by examiner

Primary Examiner—Mark F. Huff
Assistant Examiner—Daborah Chacko-Davis
(74) Attorney, Agent, or Firm—Albert J. Dalhuisen

(57) ABSTRACT

The present invention provides integrated circuit fabrication methods and devices wherein dual damascene structures (332 and 334) are formed in consecutive dielectric layers (314 and 316) having dissimilar etching characteristics. The present invention also provides for such methods and devices wherein these dielectric layers have different dielectric constants. Additional embodiments of the present invention include the use of single layer masks, such as silicon-based photosensitive materials which form a hard mask (622) upon exposure to radiation. In additional embodiments, manufacturing systems (710) are provided for fabricating IC structures. These systems include a controller (700) which is adapted for interacting with a plurality of fabrication stations (720, 722, 724, 726, 728 and 730).

14 Claims, 8 Drawing Sheets

INTERCONNECT LINE FORMED BY DUAL DAMASCENE USING DIELECTRIC LAYERS HAVING DISSIMILAR ETCHING CHARACTERISTICS

This is a divisional of co-pending application Ser. No. 09/133,075, filed on Aug. 12, 1998.

FIELD OF THE INVENTION

The present invention relates to the fabrication of semiconductor device interconnect lines and via plugs which are fabricated using dual damascene techniques.

BACKGROUND OF THE INVENTION

A semiconductor device such as an IC (integrated circuit) generally has electronic circuit elements such as transistors, diodes and resistors fabricated integrally on a single body of semiconductor material. The various circuit elements are connected through conductive connectors to form a complete circuit which can contain millions of individual circuit elements. Advances in semiconductor materials and processing techniques have resulted in reducing the overall size of the IC circuit elements while increasing their number on a single body. Additional miniaturization is highly desirable for improved IC performance and cost reduction. Interconnects provide the electrical connections between the various electronic elements of an IC and they form the connections between these elements and the device's external contact elements, such as pins, for connecting the IC to other circuits. Typically, interconnect lines form the horizontal connections between the electronic circuit elements while conductive via plugs form the vertical connections between the electronic circuit elements, resulting in layered connections.

A variety of techniques are employed to create interconnect lines and via plugs. One such technique involves a process generally referred to as dual damascene, which includes forming a trench and an underlying via hole. The trench and the via hole are simultaneously filled with a conductor material, for example a metal, thus simultaneously forming an interconnect line and an underlying via plug. Examples of conventional dual damascene fabrication techniques are disclosed in Kaanta et al., "Dual Damascene: A ULSI Wiring Technology", Jun. 11–12, 1991, VMIC Conference, IEEE, pages 144–152 and in U.S. Pat. No. 5,635,423 to Huang et al., 1997.

An example of a prior art dual damascene technique is illustrated in FIGS. 1A–1C, showing various IC structures. As depicted in FIG. 1A, a dielectric layer 110 is deposited on a semiconductor substrate 112. An etch mask 116, having a via pattern 118, is positioned on dielectric layer 110. A timed anisotropic etch is utilized to etch a hole 120 in layer 110 conforming to the via pattern. Mask 116 is subsequently replaced by mask 122 (FIG. 1B) having a trench pattern 124. A timed anisotropic etch is used to form trench 126 and to simultaneously deepen hole 120 to form via hole 128. This via hole can be etched to expose semiconductor substrate 112. Alternatively, the via hole can be over-etched partly into the substrate. As illustrated in FIG. 1C, the via hole and trench are then filled simultaneously with a suitable metal 130. Metal 130 thus forms a metallized interconnect line 132 and a via plug 134 which is in contact with semiconductor substrate 112. Additionally, a liner or barrier layer may be deposited inside the via hole and the trench prior to deposition of the interconnect metal and the via plug. The surface of layer 110 is planarized to remove excess metal 130 and to define interconnect line 132. Alternately, metal etch-back can be utilized to define the line.

Another example of prior art dual damascene is shown in IC structures illustrated in FIGS. 2A–2C. As depicted in FIG. 2A, a first dielectric layer 210 is deposited on a semiconductor substrate 212. An etch stop layer 216, is deposited on first dielectric layer 210. A second dielectric layer 218 is deposited on etch stop 216, and an etch mask 220 is positioned on dielectric layer 218. Etch mask 220 is patterned (221) for etching a via hole. Second dielectric layer 218 is etched using a first anisotropic etch procedure, to form a hole 222 (FIG. 2A) conforming to the via pattern. This etching procedure is stopped at etch stop layer 216. Etch mask 220 is removed and another etch mask 224 (see, FIG. 2B) is positioned on second dielectric layer 218 such that it is patterned (226) for forming a trench. A second anisotropic etch procedure is used to etch trench 228 in layer 218. Simultaneously, hole 222 is extended to substrate 212, by etching through etch stop layer 216 and through first dielectric layer 210. In this dual damascene technique the first etch procedure has a greater selectivity to etch stop layer 216 than the second etch procedure. As shown in FIG. 2B, the second etch procedure results in forming trench 228 and via hole 230 which extends to semiconductor substrate 212. Mask 224 is removed, after which trench 228 and via hole 230 are simultaneously filled with a suitable conductive metal 232 (see, FIG. 2C) forming metallized line 234 and via plug 236 which contacts substrate 212. Excess metal 232 is removed from the surface of layer 218 to define line 234.

Conventional dual damascene techniques, such as those exemplified above, have shortcomings for meeting the present and future requirements for reduced design rule and reduced via plug height. For example, the techniques described in connection with FIGS. 1A–1C utilize a timed etch. As is well known to those of ordinary skill in the art, it is very difficult to precisely control the etching depth when using a timed etch method. Lack of precise etching control can cause quality problems. The etch stop technique described in connection with FIGS. 2A–2C provides more etching control than a timed etch. However, this prior art technique requires the use of an additional layer, i.e. the etch stop layer. Using an additional layer results in a more complex manufacturing process.

Accordingly, a need exists for cost effective, improved methods and materials for dual damascene fabrication, such as eliminating or reducing the number of etch stop layers.

SUMMARY OF THE INVENTION

The present invention provides novel methods and structures for dual damascene containing integrated circuit devices which overcome the prior art problems described above.

In one embodiment of the present invention, a first dielectric layer is deposited on a substrate, such as a semiconductor substrate. This is followed by the deposition of a second dielectric layer on the first dielectric layer. The first and second dielectric layers have dissimilar etching characteristics, i.e. the etching properties of these two layers are such that one of the layers has a higher etch rate compared to the other layer in a specific etch chemistry. A first etch mask patterned for a via hole is provided on the second dielectric layer. The via pattern is then transferred through both dielectric layers by means of anisotropic etching. After removing the first etch mask, a second etch mask is provided on the second dielectric layer, this mask has a trench pattern which is positioned over the underlying via hole. The trench is anisotropically etched through the second dielectric layer using the first dielectric layer as an etch stop. Etch chemistry which is used for etching the trench is such that the second dielectric layer has a higher etch rate compared to the first dielectric layer. These inventive etch procedures result in a trench and an underlying via hole wherein the trench extends through the second dielectric layer while the via hole extends through the first dielectric layer. The second etch mask is removed, the trench and via are then filled simultaneously with a conductive material such as a metal, to form a dual damascene structure. Etch masks used in this embodiment can comprise photoresists, hard masks, or combinations of photoresist and hard masks, depending on the requirements for etching resistance to the etch chemistries which are used to etch the dielectric layers.

In another embodiment of the present invention, a first dielectric layer is deposited on a cap layer which is formed on a semiconductor substrate. A second dielectric layer is deposited on the first dielectric layer, such that the first and second dielectric layers have dissimilar etching characteristics. A hard mask layer is deposited on the second dielectric layer, followed by a first photoresist having a via pattern. The via pattern is anisotropically etched to the cap layer, after which the first resist is stripped and a second photoresist layer is formed on the hard mask and preferably also on the exposed portion of the cap layer in the via hole. A trench pattern is developed in the second resist. This trench pattern is anisotropically etched through the hard mask and the second dielectric layer, using the first dielectric layer as an etch stop, to form the trench. The second resist is then stripped. A further anisotropic etching process is used to simultaneously remove the hard mask and to etch the via hole through the cap layer. This process results in the formation of a trench in the second dielectric layer and an underlying via hole in the first dielectric layer and the cap layer. A liner or barrier layer is deposited in the trench and via hole. The lined trench and via hole are subsequently simultaneously filled with conductive material, thus forming a dual damascene structure. Alternatively, the dual damascene structure of the present embodiment can be fabricated without a liner.

It is particularly advantageous in the present inventive techniques to select a material for the second dielectric layer which has a low dielectric constant, such as 1 to 3.5, while selecting a first dielectric layer material which has a somewhat higher dielectric constant, such as 3.5 to 8. This selection of dielectric materials provides layer combinations which can utilize the superior electrical qualities of low dielectric constant materials with the higher mechanical qualities of the materials having a higher dielectric constant. Also, there is a significant reduction in intra-layer cross-talk. This combination is particularly suitable since these two types of dielectric materials generally require two different etch chemistries.

In still another embodiment of the present invention a first dielectric layer is deposited on a substrate. A first etch mask patterned for a via hole is positioned on the first dielectric layer. The via pattern is transferred through the first dielectric layer using a suitable anisotropic etching process, thereby forming a via hole. The first etch mask is removed and a second dielectric layer is deposited on the first dielectric layer. This second dielectric layer material fills the via hole partly or completely. A second etch mask is placed on the second dielectric layer such that this mask has a trench pattern which is positioned on the underlying via hole. A second anisotropic etching process is used to etch the trench in the second dielectric layer while simultaneously removing the second dielectric layer material from the via hole, using the first dielectric layer as an etch stop. The second etching process uses an etch chemistry such that the second dielectric layer has a higher etch rate compared to the first dielectric layer. The trench and via are filled with a conductive material upon removal of the second etch mask, thus resulting in a dual damascene structure which is similar to the above described embodiments.

In yet another embodiment of the present invention, single layer etch masks are used in combination with the above described embodiments. These single layer masks include a silicon-based photosensitive material which forms a hard mask upon exposure to radiation. A suitable example of these types of materials includes plasma polymerized methylsilane which is converted to plasma polymerized methylsilane oxide when exposed to UV light. The present embodiment provides a hard mask as a single layer, while conventional hard mask techniques require two mask layers, i.e. a photoresist and a hard mask layer.

In additional embodiments of the present invention, manufacturing systems are provided for forming fabricated structures, such as the IC structures of the present invention. These systems include a controller, such as a computer, which is adapted for interacting with a plurality of fabrication stations. Each of these fabrication stations performs a processing step which is utilized to fabricate the IC structures. Operative links provide connections between the controller and the manufacturing stations. A data structure, such as a computer program, causes the controller to control the processing steps which are performed at the fabrication stations. The data structure can be provided on a removable electronic storage medium.

DETAILED DESCRIPTION OF THE INVENTION

While describing the invention and its embodiments, certain terminology will be utilized for the sake of clarity. It is intended that such terminology include not only the recited embodiments but all equivalents which perform substantially the same function, in substantially the same manner to achieve the same result.

Figure 1A:
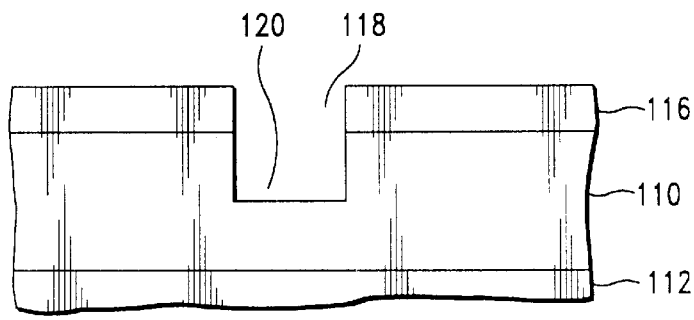
FIGS. 1A–1C are schematic cross-sectional side views illustrating prior art IC structures at sequential stages.
Figure 1B:
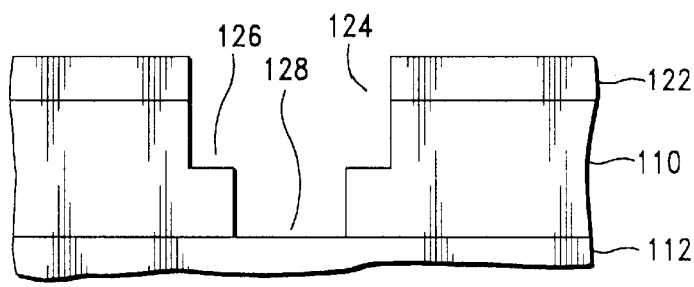
Figure 1C:
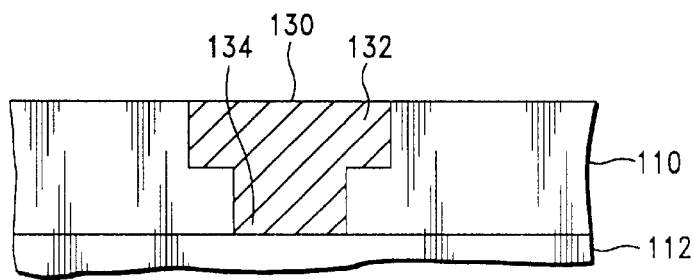
Figure 2A:
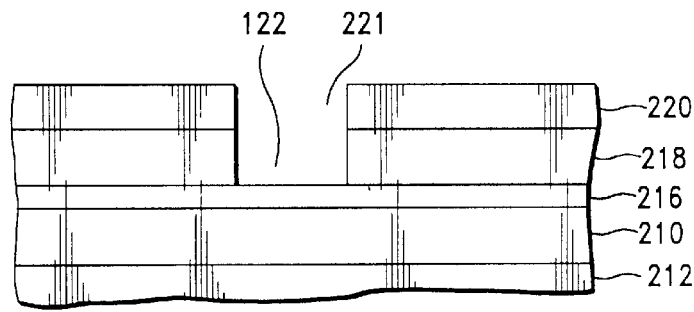
FIGS. 2A–2C are schematic cross-sectional side views illustrating prior art IC structures at sequential stages.
Figure 2B:
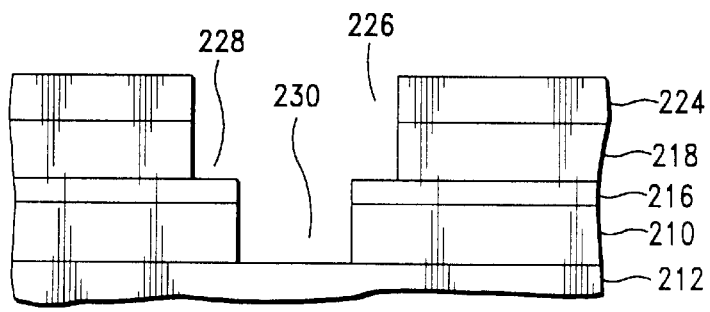
Figure 2C:
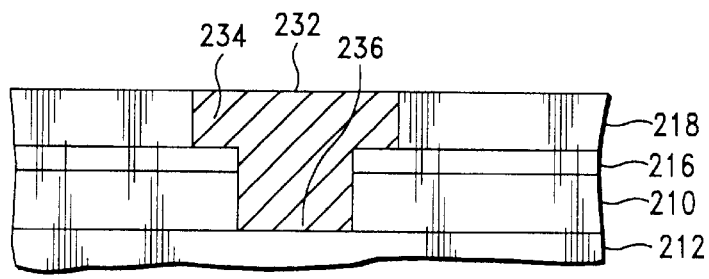
Figure 3A:
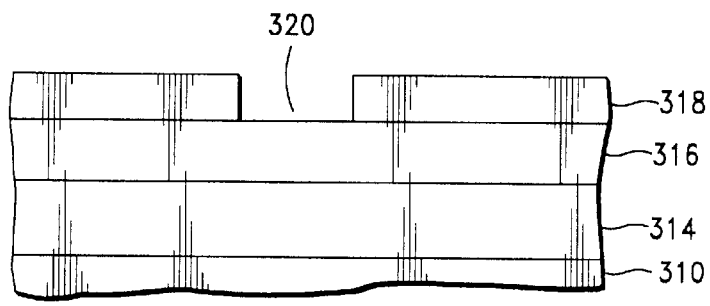
FIGS. 3A–3E are schematic cross-sectional side views illustrating an embodiment of IC structures of the present invention at sequential stages.

In one embodiment of the invention, a novel dual damascene process is employed wherein consecutive dielectric layers having dissimilar etching characteristics are used in order to selectively etch a trench and an underlying via hole in IC structures. The expression "dissimilar etching characteristics" of two materials as defined herein, includes etching properties of these materials such that one of the materials has a higher etch rate than the other material in a specific chemistry. This process is illustrated in fabricated structures, such as the IC structures shown in FIGS. 3A–3E. The expression "integrated circuit structure" as defined herein, includes completely formed integrated circuits and partially formed integrated circuits. FIG. 3A shows a first dielectric layer 314 which is deposited on a substrate, such as a semiconductor substrate 310. The expression "semiconductor substrate" as defined herein, includes structures and devices comprising typical integrated circuit elements, components, interconnects and semiconductor materials. A second dielectric layer 316 is deposited on first dielectric layer 314. The first and second dielectric layers (314 and 316) have dissimilar etching characteristics in order to selectively etch one of these layers without significantly etching the other. A first photoresist layer 318 (FIG. 3A) is deposited on a second dielectric layer 316. These dielectric and photoresist layers can be deposited by any of the methods which are well known to those of ordinary skill in the art.

Figure 3B:
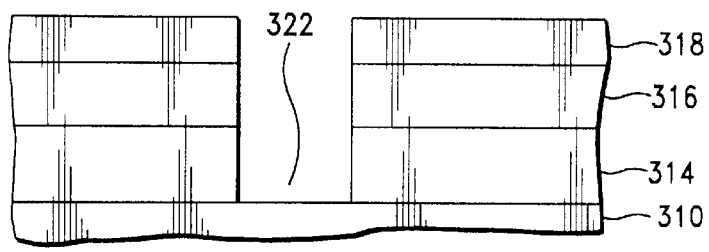

Photoresist 318 (FIG. 3A) is developed to form a via pattern 320. As depicted in FIG. 3B, a first anisotropic etching process is used to transfer the via pattern through dielectric layers 316 and 314, forming via hole 322 in dielectric layer 314 on the exposed top surface of substrate 310. The first etching process includes etching the via pattern through dielectric layer 316, and subsequently changing the etch chemistry to etch the via pattern through layer 314. It is necessary to use two different etch chemistries because the two dielectric layers have dissimilar etching characteristics. The etch chemistry which is used for etching layer 314 needs to be selective with respect to layer 316 if this chemistry is such that it degrades first photoresist 318, because this inventive technique requires layer 316 to be a mask for etching a via hole in layer 314. Where two materials are exposed to a particular etching process, the etching process is defined herein as being selective with respect to one of the materials when this material is etched at a significantly slower rate than the other material.

Figure 3C:
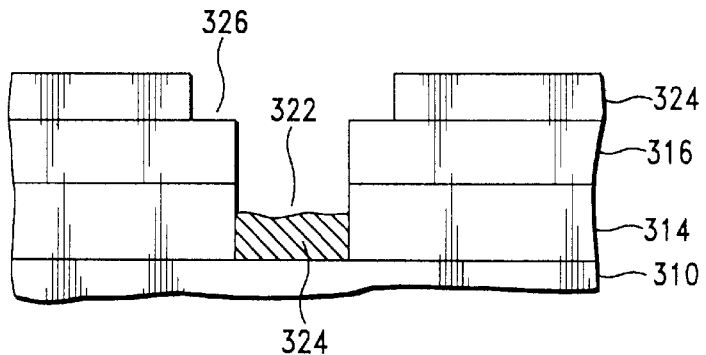
Figure 3D:
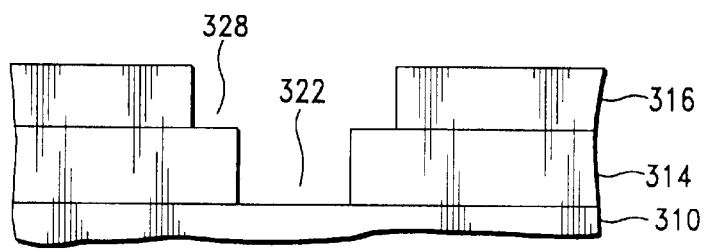
Figure 3E:
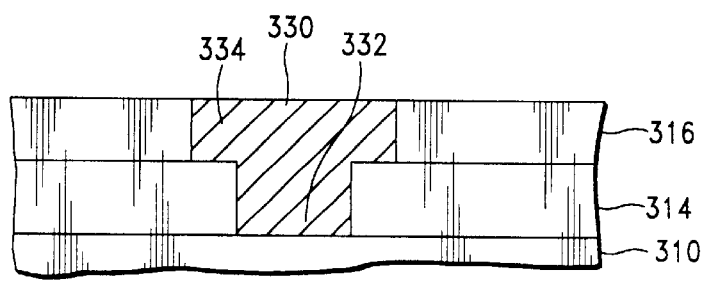

First photoresist 318 (FIG. 3B) is stripped, and second photoresist layer 324 is deposited on second dielectric layer 316, as shown in FIG. 3C. The second photoresist layer is developed to form pattern 326 which conforms to a trench pattern. Alternatively, second photoresist layer 324 is also deposited on the exposed portion of substrate 310 in via hole 322, by not fully developing the photoresist (FIG. 3C). A second anisotropic etching process is employed to etch trench 328 (FIG. 3D) in dielectric layer 316, using dielectric layer 314 as an etch stop. This is achieved by using an etching process which etches layer 316 much faster than layer 314. Photoresist 324 in via hole 322 protects substrate 310 from the second etching process. Second photoresist 324 is then stripped. Alternatively, when using a hard mask the resist should be etched away at the completion of the trench etching process. As depicted in FIG. 3E, a suitable conductor 330, such as a metal, is simultaneously deposited in via hole 322 and trench 328, thus forming interconnect line 334 and via plug 332, wherein via plug 332 contacts substrate 310. Excess conductor material is removed from the surface of layer 316, for example by planarizing using CMP (chemical-mechanical polishing) or by metal etchback. Interconnect line 334 and via plug 332 form a dual damascene structure. The expression "dual damascene structure" as defined herein, includes an interconnect line in a trench and an underlying via plug which are formed simultaneously.

Alternatively, a suitable liner (not shown) can be deposited in via hole 322 and trench 328 prior to the deposition of conductor material. Conductors such as Cu require a liner or barrier layer. An inter-metal layer is formed by first dielectric layer 314, i.e. the layer containing the via plug, typically having a thickness of 0.5 µm or less. An intra-metal layer is formed by second dielectric layer 316, which contains the metallized line. Typically, the thickness of the intra-metal layer ranges from 0.2 to 4 µm. Examples of suitable dielectric materials for one of the dielectric layers include oxides such as PECVD (plasma-enhanced chemical vapor deposition) $SiO_2$ and F—$SiO_2$, while suitable dielectric materials for the other dielectric layer include polymers, such as, amorphous fluorinated carbon based materials, spin-on dielectric polymers such as fluorinated and non-fluorinated poly(arylene) ethers (commercially known as FLARE 1.0 and 2.0, which are available from Allied Signal Company), poly(arylene) ethers (commercially known as PAE 2-3, available from Schumacher Company), divinyl siloxane benzocyclobutane (DVS-BCB) or similar products and aero-gel. These dielectric materials are well known to those of ordinary skill in the art. The oxides and the polymers have dissimilar etching characteristics because the $O_2$-based etch chemistry used for etching of polymer is highly selective with respect to $SiO_2$. On the other hand, the $CHF_x$-based etch chemistry for etching $SiO_2$ is highly selective with respect to polymer. Preferably, the metal line is passivated for example using $H_2$-based chemistry followed by depositing a protective layer, such as PECVD $Si_xN_yY_z$, on the metal line, using techniques and materials which are well known to those of ordinary skill in the art.

The inventive techniques which are described in connection with FIGS. 3A–3E utilize photoresist masks, but it will be understood that the invention is equally operable when hard masks or combinations of photo masks and hard masks are used. For example, a hard mask can be used if a photoresist does not have a sufficiently low etch rate for the etching procedures used in etching the dielectric layers, or for an over-etching step to etch into the underlying substrate 310 to assure low resistivity contact between the dual damascene via plug and the underlying conductor.

The novel dual damascene techniques of the present invention avoid the use of a timed etch, resulting in improved etch depth control. Also, the present invention avoids the use of an etch stop layer between the inter-metal layer and the intra-metal dielectric layers, thus facilitating fabrication and resulting in quality improvements and cost reductions. Additional advantages of the present invention compared with prior art dual damascene techniques are obtained by judiciously selecting the dielectric materials for inter-metal and intra-metal layers such that a layer combination is obtained wherein the mechanical, thermal and electrical properties are optimized while maintaining the above described advantages of etch selectivity.

Desirably, dielectric materials for use in dual damascene structures exhibit high mechanical strength and a low k (dielectric constant). As defined to herein, the term "low k material" refers to dielectric materials wherein k=1–3.5. "High k material" as defined herein refers to dielectric materials wherein k>3.5. As is well known to those of ordinary skill in the art, low k materials such as the following materials have relatively low physical strength. For example, such low k materials as polymers, e.g. poly (arylene) ethers, fluorinated poly(arylene) ethers and divinyl siloxane benzocyclobutane, or aero gel have relatively low mechanical strength and films composed of these materials are generally prone to cracking unless the layer is very thin. Also, high aspect lines of these materials are likely to collapse. However, use of low k materials is highly desirable because of their superior dielectric properties, such as ree capacitance and reduced power loss as compared with high k materials. According to the present invention, low k and high k dielectric materials can be utilized advantageously in the structures described in connection with FIGS. 3A–3E, by selecting for example a low k material for use in the second dielectric layer 316 (i.e. the intra-metal layer) and a relatively high k material for use in the first dielectric layer 314 (the inter-metal layer). This selection of dielectric materials makes it possible to reduce the thickness of the intra-metal layer, compared with conventional techniques.

Mechanical strength of the combination of the two dielectric layers is obtained mainly from the inter-metal layer, for example using $SiO_2$. Resistance to cracking of some low k materials is relatively poor, but this is overcome by using thin layers of low k material in the present invention. Preferably, the low k layer should be significantly thinner than the high k layer. Additionally, an important advantage of the present invention is a 10 to 20% reduction in cross talk for the combination of layers wherein one layer comprises a low k material and the other layer comprises a high k material, as compared with using low k materials for both the inter-metal layer and the intra-metal layer. A further advantage of the techniques of the present invention is derived from the fact that the vias are formed separately from the trenches which means that the via size is not reduced when there is a misalignment between the via and the trench, because the via hole is completely formed through both dielectric layers before the trench is formed. This feature allows for designs wherein the width of the metal lines is substantially similar to the diameter of the underlying vias.

Figure 4A:
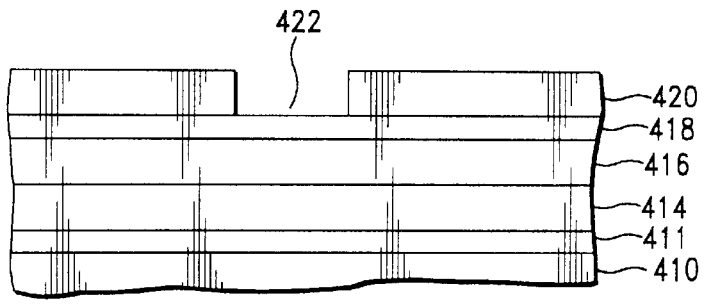
FIGS. 4A–4F are schematic cross-sectional side views illustrating another embodiment of IC structures of the present invention at sequential stages.
Figure 4B:
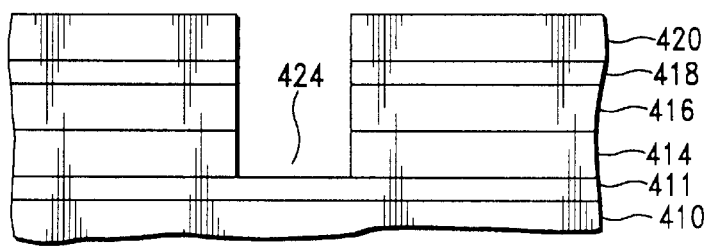
Figure 4C:
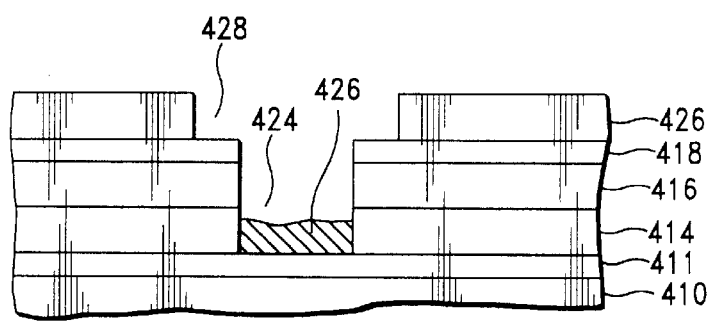

Another embodiment of the present invention is illustrated in FIGS. 4A–4F, showing various fabricated structures, such as IC structures, which employ a photoresist and hard mask, and using an etch stop or cap layer such as a nitride layer on the substrate. The structure shown in FIG. 4A utilizes a stop or cap layer, such as a nitride 411 deposited on a substrate, such as semiconductor substrate 410. A first dielectric layer 414 is deposited on cap 411. A second dielectric layer 416 is deposited on first dielectric layer 414. First and second dielectric layers 414 and 416 respectively, have dissimilar etching characteristics in order to selectively etch one of these layers without significantly etching the other layer. One of the dielectric layers could for example comprise oxides such as PECVD $SiO_2$, while suitable materials for the other dielectric layer could include low k materials, such as the polymers described in connection with FIGS. 3A–3E. As illustrated in FIG. 4A, a hard mask layer 418 followed by a first photoresist 420 are deposited on layer 416. A via pattern 422 is developed in the first photoresist. The via pattern is then etched to cap 411, forming via hole 424 (FIG. 4B) in layer 414 using a first anisotropic etching process. The etching process for forming via hole 424 is similar to the process for forming via hole 322, as described in connection with FIG. 3B. First photoresist 420 is stripped and a second photoresist 426, depicted in FIG. 4C, is deposited on the exposed surface of hard mask 418. Alternatively, resist 426 can also be deposited on the exposed portion of cap 411 in via hole 424. It will be understood that hard mask 418 may be partly or completely removed through prior etching steps when second photoresist 426 is deposited on the structure. A trench pattern 428 is developed in the second photoresist. The dielectric, mask and etch stop layers can be deposited by any of the methods which are well known to those of ordinary skill in the art.

Figure 4D:
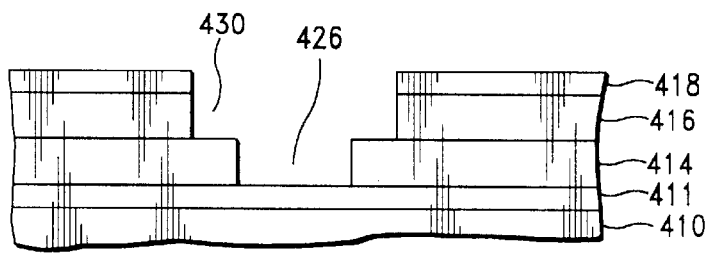
Figure 4E:
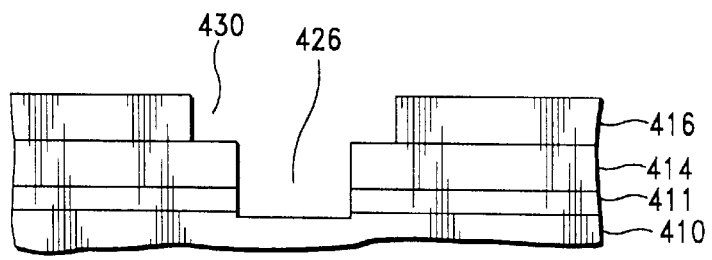
Figure 4F:
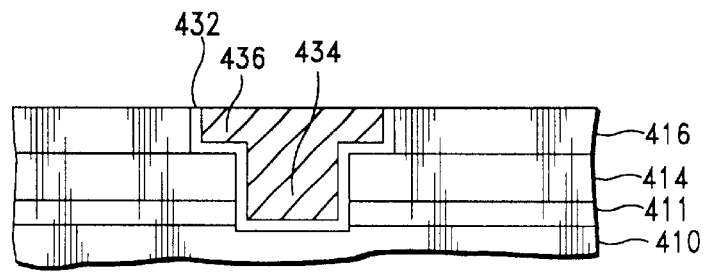

As shown in FIG. 4D, a second anisotropic etching process is used to transfer the trench pattern through hard mask 418 and through dielectric layer 416, using dielectric layer 414 and cap 411 as etch stops, thereby forming trench 430. Alternatively, photoresist 426 deposited in via hole 424 can be utilized to protect the exposed portion of cap 411 from the second etching process, if this process is capable of etching the cap at a significant rate. Similar to the description in connection with FIG. 3D, dielectric layer 414 is an etch stop when layers 414 and 416 have dissimilar etching characteristics such that the etch chemistry for layer 416 is highly selective with respect to layer 414. Second photoresist 426 is then removed. This is followed by a third anisotropic etch to selectively remove hard mask 418 and cap 411 inside via hole 426, as depicted in FIG. 4E. A barrier layer 432 (FIG. 4F) is deposited inside via hole 426 and trench 430. A conductive material, such as a metal, is deposited inside the liner simultaneously forming via plug 434 and metal line 436, wherein metal line 436 and via plug 434 form a dual damascene structure. A planarizing step such as CMP or metal etch-back is used to define metal line 436. The invention is equally operable without the use of liner or barrier layer 432 when the conductive metal does not require a liner or barrier layer.

The advantages which are described in connection with FIGS. 3A–3E are equally applicable to the fabrication methods and materials which are described in connection with FIGS. 4A–4F. In addition the latter provide a highly suitable method for simultaneously removing the hard mask and the cap without affecting the definition of the trench and via hole to any significant extent.

Figure 5A:
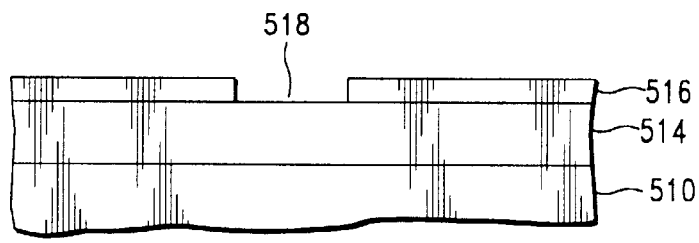
FIGS. 5A–5F are schematic cross-sectional side views illustrating another embodiment of IC structures of the present invention at sequential stages.
Figure 5B:
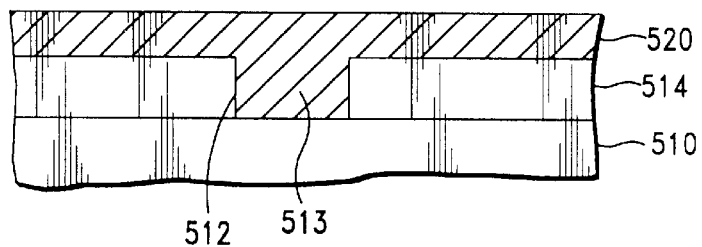
Figure 5C:
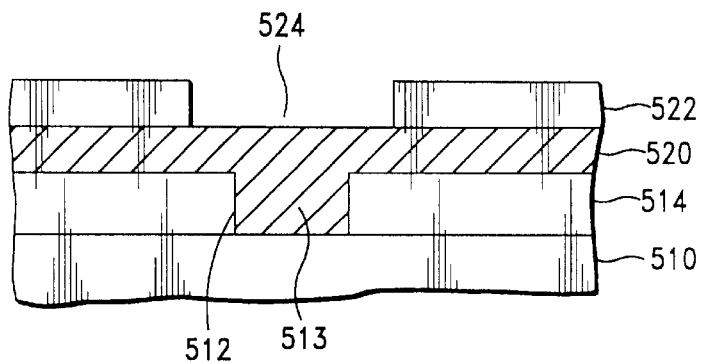

A further embodiment of the present invention involving consecutive dielectric layers having dissimilar etching characteristics is illustrated in fabricated structures, such as the IC structures of FIGS. 5A–5F. FIG. 5A shows a first dielectric layer 514, such as PECVD $SiO_2$ or $F-SiO_2$, which is deposited on a substrate, such as semiconductor substrate 510. A first photoresist 516 is deposited on dielectric layer 514 and a via pattern 518 is developed in this photoresist. As shown in FIG. 5B, the via pattern is transferred through layer 514, forming via hole 512 in layer 514 and stopping the etch on semiconductor substrate 510. The resist is stripped and a second dielectric layer 520 (FIG. 5B), is deposited on layer 514, also forming plug 513 which completely or partly fills via hole 512 in layer 514. A second photoresist 522, shown in FIG. 5C, is deposited on second dielectric layer 520. Deposition of the dielectric and photoresist layers can be achieved by any of the methods which are well known to those of ordinary skill in the art.

Figure 5D:
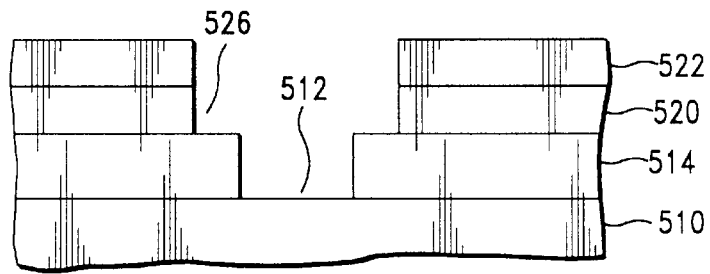

The second photoresist is developed to form a trench pattern 524 (FIG. 5C). Layer 520 is anisotropically etched using layer 514 and semiconductor substrate 510 as the etch stops, thereby forming trench 526, see FIG. 5D. The anisotropic etching process which is used to create trench 526 in layer 520 is also used to remove plug 513 from via hole 512 (FIG. 5D). Dielectric layers 514 and 520 have dissimilar etching characteristics (similar to dielectric layers 314 and 316 of FIGS. 3A–3E), such that the etching process for etching layer 520 is highly selective with respect to layer 514 and substrate 510. Alternatively, semiconductor substrate 510 may have a cap (not shown), such as a nitride. Additionally, a hard mask (not shown) may be interposed between the second photoresist and layer 520, in which case the cap and hard mask are anisotropically etched to remove the hard mask and to etch the via pattern through the cap layer.

Figure 5E:
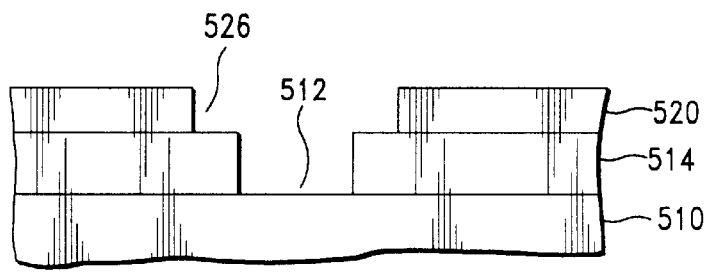
Figure 5F:
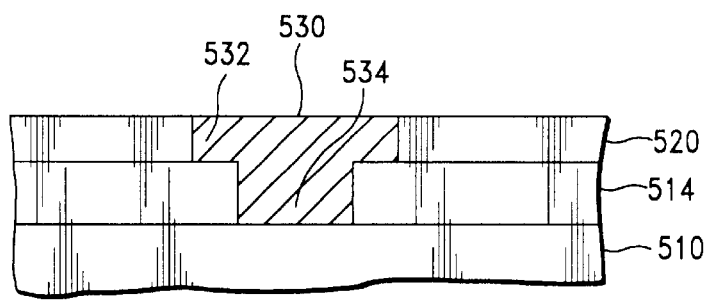

Second photoresist 522 is stripped, resulting in the structure of FIG. 5E which has a trench 526 in layer 520 and a via hole 512 in layer 514. A conductive material, such as a metal 530 as shown in FIG. 5F, is simultaneously deposited in trench 526 and via hole 512 forming a dual damascene structure having metal line 532 and via plug 534. Excess metal 530 is removed from the surface of layer 520, using for example CMP or metal etch-back. In an alternative embodiment (not shown) a liner can be interposed between metal 530 and dielectric layers 514 and 520. Layer 514 is the intra-metal layer of structure in FIGS. 5D–5F, similar to layer 314 (FIGS. 3A–3F). Layer 520 is the inter-metal layer which is similar to layer 316. The advantages which are described in connection with FIGS. 3A–3E are equally applicable to the fabrication methods and materials which are described in connection with FIGS. 5A–5F. It is also anticipated that the novel techniques of the present invention results in additional improved dual damascene fabrication techniques because the via etch does not require etching of very deep vias, as compared with prior art dual damascene techniques.

Figure 6A:
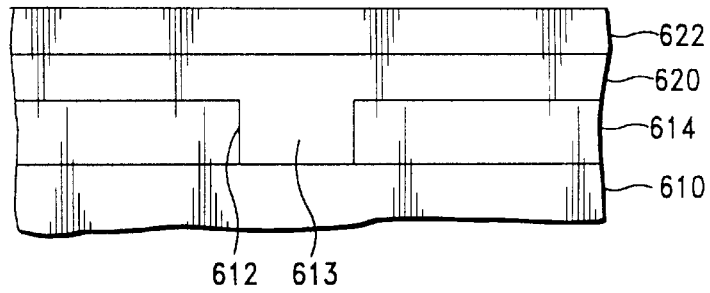
FIGS. 6A–6C are schematic cross-sectional side views illustrating another embodiment of IC structures of the present invention at sequential stages.

The novel techniques of the present invention are operable with photo or hard masks or combinations of photo masks and hard masks. Hard masks, such as $SiO_2$ or silicon nitride, are preferred for $O_2$-based etch chemistry used in the selective etching of many low k materials, because of the poor etch resistance of typical photoresist materials to $O_2$-based etching. Conventional hard mask technology entails the use of a photoresist on a hard mask layer, thus using two mask layers. The photoresist is developed and the pattern is transferred to the hard mask layer. Advantageously, the present invention is well suited to hard mask preparation techniques using a single layer of silicon-based photosensitive material as is disclosed in commonly assigned U.S. patent application Ser. No.: 09/017,350, filed: Feb. 2, 1998. An embodiment of the present invention utilizing the single layer hard mask technology is illustrated in the IC structures shown in FIGS. 6A–6C. As depicted in FIG. 6A, a first dielectric layer 614, such as PECVD $SiO_2$, is deposited on semiconductor substrate 610. Hole 612, conforming to the ultimate via, is formed in this layer as is described in connection with FIG. 5A. A second dielectric layer 620 is deposited on layer 614 and partly or completely filling hole 612 by forming plug 613, as described in connection with FIG. 5B, wherein the first and second dielectric layers have dissimilar etching characteristics. Suitable materials for dielectric layer 620 include low k materials, such as amorphous fluorinated carbon or organic spin-on dielectric materials such as described in connection with the embodiments illustrated in FIGS. 3A–5E. A layer of silicon-based photosensitive mask material 622 is deposited on second dielectric layer 620. Suitable materials for mask layer 622 include CVD PPMS (plasma polymerized methylsilane), such as shown in U.S. Pat. No. 5,439,780 herein incorporated by reference.

Figure 6B:
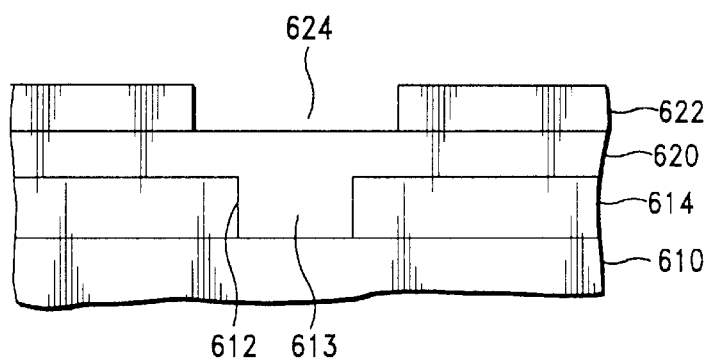
Figure 6C:
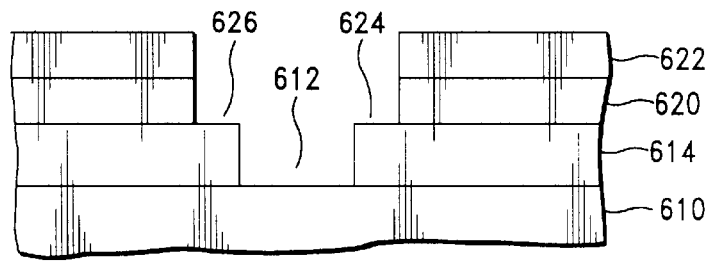

The PPMS layer is selectively exposed to UV light converting the exposed portion of the PPMS layer into PPMSO (plasmapolymerized methylsilane oxide). The etch pattern in layer 622 is developed by removing the unexposed PPMS portion of the layer, resulting in opening 624 (FIG. 6B) conforming to the trench configuration of the dual damascene process. Unexposed PPMS is removed using for example a $Cl_2$ or $Cl_2$-HBr based plasma etch. This etch chemistry is particularly suitable for dual damascene technology involving low k materials since the etch resistance of many of these materials is generally excellent for this etch chemistry. As depicted in FIG. 6C, anisotropic $O_2$-based plasma etching is used to create trench 626 and via hole 612. Trench 626 and via hole 612 are simultaneously filled with a suitable conductor material as is described in connection with FIG. 5F. The resulting metal line is defined, for example using CMP, which also removes mask 622. The mask technology of using a single layer of silicon-based photosensitive material, such as described in connection with FIGS. 6A–6C is equally operable when used with embodiments of the present invention which are illustrated in FIGS. 3A through 5F.

It will be understood that it is necessary to clean or prepare the surface of the structure prior to the deposition of any layer in any subsequent fabrication step, using surface preparation methods and materials which are well known to those of ordinary skill in the art. It will also be understood that methods for removing resist include conventional dry and wet methods.

Figure 7:
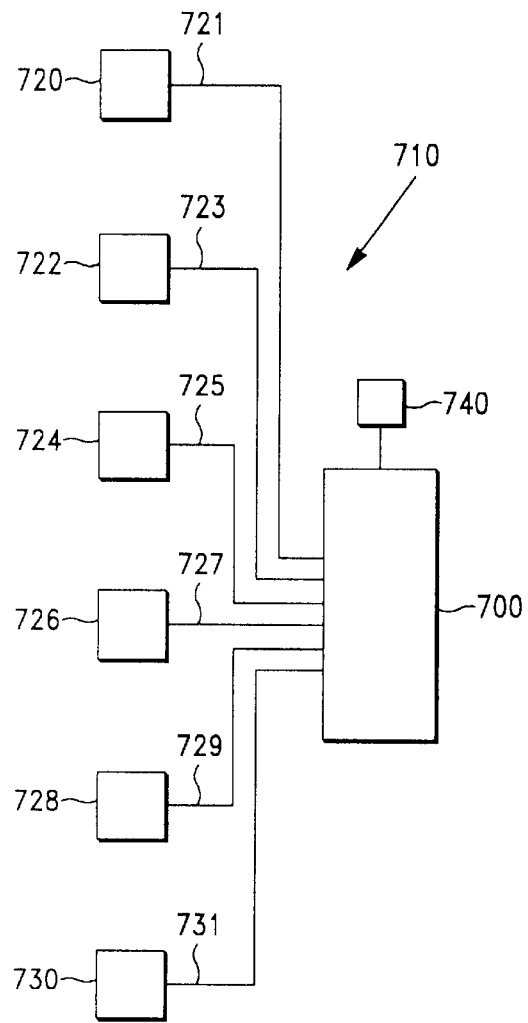
FIG. 7 is a block diagram illustrating a manufacturing system for fabricating the IC structures of FIGS. 3A–3E.

The novel dual damascene fabrication techniques of the present invention require a sequence of processing steps. Each processing step can be performed at a fabrication station. All or some of the fabrication stations and their respective processing steps can be integrated by means of a novel apparatus including a controller 700 illustrated in FIG. 7. Controller 700 is adapted for controlling a number of fabrication stations which are utilized in the formation of fabricated structures, such as the IC structures described in connection with FIGS. 3A–3E. As illustrated in FIG. 7, a novel manufacturing system 710 for fabricating IC structures includes controller 700 and a plurality of fabrication stations: 720, 722, 724, 726, 728 and 730. Additionally, system 710 has operative links 721, 723, 725, 727, 729 and 731 which provide connections between controller 700 and fabrication stations 720, 722, 724, 726, 728 and 730 respectively. The novel apparatus includes a data structure such as a computer program which causes controller 700 to control the processing steps at each of the fabrication stations and to, optionally, regulate the sequence in which fabrication stations are used in order to form the novel structures.

Examples of suitable controllers include conventional computers and computer systems including one or more computers which are operably connected to other computers or to a network of computers or data processing devices. Suitable computers include computers commonly known as personal computers. The data structure which is used by controller 700 can be stored on a removable electronic data storage medium 740 (FIG. 7), such as computer floppy disks, removable computer hard disks, magnetic tapes and optical disks, to facilitate the use of the same data structure at different manufacturing locations. Alternatively, the data structure can be stored on a non-removable electronic data storage medium, including a medium positioned at a location which is remote (not shown) from controller 700, using such data storage devices as are well known to those or ordinary skill in the art. The data structure can be communicated from a remote location to controller 700 using communicating techniques which are well known to those of ordinary skill in the art including hard wire connections, wireless connections and data communication methods utilizing one or more modems or techniques using one or more computers commonly known as servers. The data storage medium can be operably connected to the controller using methods and device components which are well known to those of ordinary skill in the art. Examples of suitable fabrication stations for manufacturing system 710 include the stations shown in Table A.

TABLE A

| Station | Processing Step |
| --- | --- |
| 720 | depositing a first dielectric layer on a substrate |
| 722 | depositing a second dielectric layer on the first dielectric layer |
| 724 | depositing a first etch mask layer, having a via pattern, on the second dielectric layer |
| 726 | anisotropically etching the via pattern through the first and second dielectric layers |
| 728 | removing the first etch mask layer |
| 730 | etching a trench in the second dielectric layer on the underlying via |

Additional fabrication stations can be added to manufacturing system 710. It is also contemplated that one or more fabrication stations can be positioned at a location which is remote from the other fabrication stations in which case an additional controller or a network of controllers can be employed to control the remotely located manufacturing station.

As illustrated in FIG. 7, controller 700 is adapted to be connected to each of the manufacturing stations through operative links. Each of the se links provides a bidirectional connection enabling controller 700 to transfer commands from its data structure, such as specific operating parameters, and to receive information, such as test data, from the fabrication station. The operative links can be in the form of hard wire connections or wireless connections.

Figure 8:
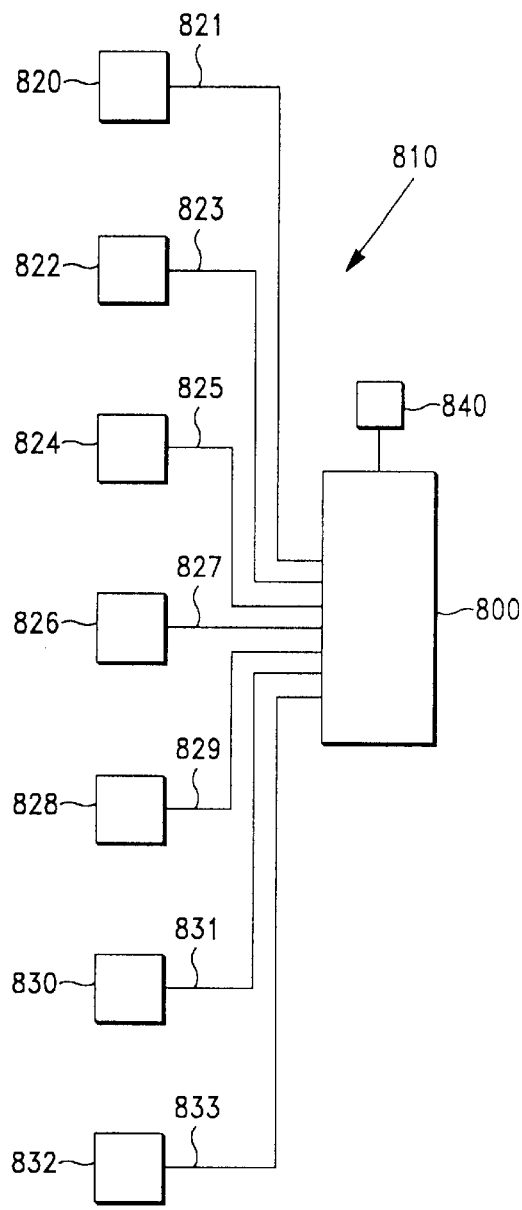
FIG. 8 is a block diagram illustrating a manufacturing system for fabricating the IC structures of FIGS. 5A–5F.

FIG. 8 depicts another embodiment of the present invention. A novel apparatus including inventive controller 800 is adapted for controlling fabrication stations which are utilized in the formation of fabricated structures, such as IC structures described in connection with FIGS. 5A–5F. Fabrication stations 820, 822, 824, 826, 828, 830 and 832 are connected to controller 800 through operative links 821, 823, 825, 827, 829, 831 and 833 respectively. The novel apparatus includes a data structure which causes the controller to control the processing steps at each of the fabrication stations. A novel manufacturing system 810 for manufacturing the structures illustrated in FIGS. 5A–5F includes controller 800, the data structure, the above manufacturing stations and the operative links. The data structure can be provided on a removable electronic storage medium 840. The controller, the data structure, the operative links and the removable storage medium are similar to those described in connection with FIG. 7. Examples of suitable fabrication stations for manufacturing system 810 include the stations shown in Table B.

TABLE B

| Station | Processing Step |
| --- | --- |
| 820 | depositing a first dielectric layer on a substrate |
| 822 | depositing a first etch mask layer, having a via pattern, on the first dielectric layer |
| 824 | anisotropically etching a via hole in the first dielectric layer |
| 826 | removing the first etch mask layer |
| 828 | depositing a second dielectric layer on the first dielectric layer |
| 830 | depositing a second etch mask layer, having a trench pattern, on the second dielectric layer |
| 832 | anisotropically etching the trench pattern through the second dielectric layer |

Suitable semiconductor materials for use in semiconductor substrates of the present invention include silicon, germanium, silicon/germanium alloys, gallium arsenide and indium/gallium/arsenide/phosphide. Typically, dual damascene structures of the present invention contact a metallized line on the semiconductor substrate. Suitable conductive materials for filling the dual damascene trenches and via holes of the present invention include metals such as Cu, Ag. Al, W, their alloys and mixtures of these metals with or without alloys. While the embodiments of the invention are described and illustrated using metal interconnect lines and metal dual damascene structures, the invention is equally operable when conductive materials other than metals are used. Suitable conductive materials include metallic and nonmetallic superconductors, i.e. materials having zero direct current resistance at or below their superconducting transition temperature, such as metallic nickel/germanium and nonmetallic yttrium/barrier/copper oxides. Suitable techniques for simultaneously filling dual damascene trenches and via holes include CVD, PVD, electroplating and electroless plating. These techniques are well known to those of ordinary skill in the art.

The invention has been described in terms of the preferred embodiment. One skilled in the art will recognize that it would be possible to construct the elements of the present invention from a variety of means and to modify the placement of components in a variety of ways. While the embodiments of the invention have been described in detail and shown in the accompanying drawings, it will be evident that various further modifications are possible without departing from the scope of the invention as set forth in the following claims.

We claim:

1. A method of forming a structure on a substrate, the method comprising:
   a) depositing a first dielectric layer on the substrate;
   b) depositing a first etch mask layer having a via pattern on the first dielectric layer;
   c) anisotropically etching a via hole in the first dielectric layer;
   d) removing the first etch mask layer;
   e) depositing a second dielectric layer on the first dielectric layer and also in the via hole thereby forming a plug that completely fills the via hole, wherein the first and second dielectric layers comprise materials having dissimilar etching characteristics;
   f) depositing a second etch mask layer, having a trench pattern overlaying the via hole, on the second dielectric layer;
   g) selecting an etching process that is selective with respect to the first dielectric layer and to the substrate; and
   h) employing the etching process for anisotropically etching a trench in the second dielectric layer and for etching the plug thereby opening the via hole, whereby the trench and the via hole are adapted for fabricating a dual damascene structure.

2. The method of claim 1 wherein the first and second dielectric layer materials have different dielectric constants.

3. The method of claim 1 wherein the first dielectric layer has a higher dielectric constant than the second dielectric layer.

4. The method of claim 1 wherein the first dielectric layer material has a dielectric constant ranging from about 3.5 to about 8 and wherein the second dielectric layer material has a dielectric constant ranging from about 1 to about 3.5.

5. The method of claim 1 wherein the first dielectric layer material comprises one or more materials selected from the group consisting of $SiO_2$ and fluorinated $SiO_2$.

6. The method of claim 5 wherein the second dielectric layer material comprises one or more materials selected from the group consisting of amorphous fluorinated carbon, organic spin-on materials, spin-on-glass, aero-gel, poly (arylene) ethers, fluorinated poly(arylene) ethers and divinyl siloxane benzocyclobutane.

7. The method of claim 5 wherein anisotropically etching a trench comprises an $O_2$-based chemistry.

8. The method of claim 1 wherein depositing the second etch mask layer comprises depositing a mask selected from the group consisting of photoresist masks, hard masks and combinations of photoresist masks and hard masks.

9. The method of claim 1 wherein depositing a second etch mask layer comprises:
   a) depositing a layer of silicon-based photosensitive material on the first dielectric layer; and
   b) patterning the layer of silicon-based photosensitive material to define the trench pattern.

10. The method of claim 9 wherein the silicon-based photosensitive material is plasma polymerized methylsilane which is patterned by exposure to radiation such that exposure causes the plasma polymerized methylsilane to form a hard mask comprising plasma polymerized methylsilane oxide.

11. The method of claim 1 additionally comprising filling the trench and the via hole with a conductive material, whereby a dual damascene structure is formed.

12. The method of claim 11 wherein the conductive material comprises a material selected from the group consisting of metals, alloys, metallic superconductors and non-metallic superconductors.

13. The method of claim 11 wherein the conductive material comprises one or more materials selected from the group consisting of Cu, Ag, Al, W, Cu alloys, Ag alloys, Al alloys, W alloys, nickel/germanium and yttrium/barium/copper oxides.

14. The method of claim 11 wherein filling the trench and the via hole comprises methods selected from the group consisting of chemical vapor deposition, physical vapor deposition, electroplating and electroless plating.

* * * * *